US012628281B2

(12) United States Patent
Rotte

(10) Patent No.: US 12,628,281 B2
(45) Date of Patent: May 12, 2026

(54) METHOD FOR PRODUCING MULTI-LAYER CIRCUIT BOARDS

(71) Applicant: Ulrich Rotte Anlagenbau und Foerdertechnik GmbH, Salzkotten (DE)

(72) Inventor: Ulrich Rotte, Salzkotten (DE)

(73) Assignee: Ulrich Rotte Anlagenbau und Foerdertechnik GmbH, Salzkotten (DE)

( * ) Notice: Subject to any disclaimer, the term of this patent is extended or adjusted under 35 U.S.C. 154(b) by 67 days.

(21) Appl. No.: 18/604,467

(22) Filed: Mar. 13, 2024

(65) Prior Publication Data

US 2024/0224434 A1     Jul. 4, 2024

Related U.S. Application Data

(63) Continuation of application No. PCT/DE2022/100670, filed on Sep. 12, 2022.

(30) Foreign Application Priority Data

Sep. 14, 2021     (DE) ..................... 10 2021 123 685.1

(51) Int. Cl.
*H05K 3/46*          (2006.01)
(52) U.S. Cl.
CPC ......... *H05K 3/46* (2013.01); *H05K 2203/068* (2013.01); *H05K 2203/163* (2013.01)
(58) Field of Classification Search
CPC ............... H05K 3/46; H05K 2203/068; H05K 2203/163
See application file for complete search history.

(56) References Cited

U.S. PATENT DOCUMENTS 4,859,271 A * 8/1989 Fazlin ..................... B32B 37/06
                                                              156/382
8,699,660 B2 4/2014 Joshi et al.
                     (Continued)

FOREIGN PATENT DOCUMENTS

CN          102217432 A     10/2011
CN          103376809 A     10/2013
                     (Continued)

OTHER PUBLICATIONS

Machine translation of DE 102016113985 A1 (Year: 2018).*
                     (Continued)

*Primary Examiner* — Vishal I Patel
(74) *Attorney, Agent, or Firm* — Muncy, Geissler, Olds & Lowe, P.C.

(57)          ABSTRACT

A method for producing multi-layer circuit boards, wherein, in an assembly method step, multiple functional layers and at least one insulating layer of a circuit board to be produced are arranged in layers between a tool lower part and a tool upper part of a multi-part tool. At least one measuring transducer is positioned between the tool upper part and the tool lower part such that the measuring transducer is in contact with at least one functional layer and/or insulating layer of the circuit board to be produced. The tool is then introduced into a thermo-compression chamber. The tool upper part and the tool lower part, along with the multiple functional layers and the at least one insulating layer and the measuring transducer provided between same, are then pressed against one another in the thermo-compression chamber and heated and measurement values are detected with the measuring transducer.

18 Claims, 5 Drawing Sheets

(56)  References Cited

U.S. PATENT DOCUMENTS

| | | |
|---|---|---|
| 2011/0207392 A1 | 8/2011 | Ebermann et al. |
| 2014/0020245 A1 | 1/2014 | Ceraso |

FOREIGN PATENT DOCUMENTS

| | | | |
|---|---|---|---|
| CN | 113348082 A | 9/2021 | |
| DE | 102013203708 A1 | 9/2014 | |
| DE | 102016113985 A1 | 2/2018 | |
| EP | 3921157 B1 * | 7/2025 | ............. H05K 3/022 |
| IT | 201900001739 A1 | 8/2020 | |
| KR | 1020140039900 A | 4/2014 | |

OTHER PUBLICATIONS

International Search Report dated Jan. 17, 2023 in corresponding application PCT/EP2022/100670.
Chinese Office Action dated Nov. 17, 2025 in corresponding application CN 202280060527.6.

* cited by examiner

METHOD FOR PRODUCING MULTI-LAYER CIRCUIT BOARDS

This nonprovisional application is a continuation of International Application No. PCT/DE2022/100670, which was filed on Sep. 12, 2022, and which claims priority to German Patent Application No. 10 2021 123 685.1, which was filed in Germany on Sep. 14, 2021, and which are both herein incorporated by reference.

BACKGROUND OF THE INVENTION

Field of the Invention

The invention relates to a method for the production of multi-layer circuit boards, wherein initially, within an assembly method step, a plurality of functional layers and at least one insulation layer of a circuit board to be produced are arranged in a layered manner between a tool lower part and a tool upper part of a multi-part tool and at least one measurement value sensor is positioned between the tool holder upper part and the tool holder lower part such that the measurement value sensor lies against at least one functional layer and/or insulation layer of the circuit board to be produced, wherein then, within an equipping method step, the tool with the plurality of functional layers and the at least one insulation layer and the measurement value sensor is inserted into a thermo-compression chamber, and wherein then, within a production method step, the tool upper part and the tool lower part with the plurality of functional layers provided therebetween and the at least one insulation layer and the measurement value sensor are pressed against each other and heated in the thermo-compression chamber, and measurement values are detected by the measurement value sensor.

Description of the Background Art

Multi-layer circuit boards are currently usually produced in a multi-platen heat press, wherein suitable process parameters for the operation of the multi-platen press heater are determined within experimental testing of the production process, and the subsequent mass production is carried out using the process parameters experimentally determined in this way.

In order to ascertain the necessary parameters during the experimental testing, in particular copper-based functional layers and insulation layers are laid one on top of the other in an alternating manner in the tool as a preparatory step in the assembly method step. A temperature sensor as the measurement value sensor is positioned between two of these layers and a signal line is fed out of the tool. The temperature sensor thus forms a lost sensor which cannot be reused.

A free end of the signal line is typically temporarily fixed to an outer side of the tool, for example by means of an adhesive strip. The equipped tool is then inserted with a multiplicity of further tools into a multi-platen heat press in the equipping method step. The tool lower part thus lies on a heating plate of the multi-platen heat press and is aligned and/or positioned relative to same. The heating plate serves as the support for the tool. The tool upper part is spaced apart from a further heating plate disposed above same, which—with the exception of the uppermost heating plate—supports a further equipped tool.

Now, in order to ascertain measurement values and to be able to determine process parameters in the experimental testing, the free ends of the signal line are released from the respective tool and connected to a data storage box which is disposed with the heating plates and the tools in a thermo-compression chamber of the multi-platen heat press. The thermo-compression chamber is then closed and the heating plates are moved towards each other in a subsequent production method step in such a way that the tools are located sandwiched between two heating plates and heat the equipped tools, wherein the functional and insulation layers in the tool are connected under pressure. During this process, in particular the temperature inside the tool is measured by means of the temperature sensor.

The determination of the process parameters is effected off-line within the experimental testing. During the experimental testing, the data are merely captured and collected in the data storage box. The processing and evaluation of the data are effected downstream. The measurement values ascertained during the experimental testing specifically do not serve for intervention in the on-going production method step in a controlling or regulating manner. Furthermore, by reason of the restricted space available and the temperatures of typically 100° C. or more prevailing there, the work involved in manually cabling the individual temperature sensors in the hot multi-platen heat press is laborious, time-consuming and involves a burns risk for the machine operator.

In exceptional cases, the procedure described above for the case of experimental testing is also applied within the mass production of circuit boards. However, by reason of the large amount of time involved and the high costs associated therewith, this work is only carried out in exceptional cases, for example when the circuit boards to be produced are used in safety-critical applications and the user thus places particular demands on production monitoring and documentation. However, use of the measurement values for on-line intervention in the on-going production method step is also not effected in this case.

SUMMARY OF THE INVENTION

It is therefore an object of the present invention to provide an improved method for the production of multi-layer circuit boards.

To achieve the object, the invention is characterized in an example in that the measurement values and/or data obtained therefrom are transferred to a production control device during the on-going production method step, and in that the measurement values and/or the data obtained therefrom are processed by the production control device for monitoring the on-going production method step and/or for controlling the on-going production method step in relation to a set value for a measurement variable of the measurement value sensor.

A particular advantage of the invention resides in the fact that intervention in the on-going production method step is possible by the on-line detection and processing of the measurement values. The production method step can be monitored and readjusted in relation to relevant process parameters, for example the temperature in the thermo-compression chamber or in the tool and/or the pressure applied to the tool. In this way, the process course can be optimized and optionally can be terminated earlier than intended. Consequently, the process time or the cycle duration is reduced and the throughput can be increased. The higher throughput then directly results in a reduction in costs or an increase in production quantities.

In addition, quality monitoring can be installed by the improved monitoring of the on-going production method step which makes it possible to identify errors in the production method before the produced circuit boards are delivered and enter the market. The product quality can be increased thereby. Furthermore, the costs for error correction or recall of defective products are reduced. Furthermore, in particular in safety-critical applications, an increased requirement for documentation of the production can be satisfied and the risk of failure can be lowered.

In terms of the present invention, the term "production control device and/or the control of the on-going production method step" can include control and regulation devices or control and regulation interventions in equal measure.

In accordance with the invention, the measurement values obtained using the measurement value sensor and/or the data obtained therefrom can be transferred and used for monitoring or controlling the on-going production method step. The term "data obtained from the measurement values" can include in particular, but not exclusively, data which are obtained by smoothing, compression, aggregation and/or mathematical processing of the measurement values of the measurement value sensor.

The measurement values determined by the measurement value sensor and/or the data obtained therefrom, can be transferred in a hybrid manner i.e. in any case in part wirelessly and in part via cables or wires. In an advantageous manner, the raw boundary conditions of production and the logistical challenges in the production process can be equally satisfied by the hybrid transfer of the measurement values and/or the data obtained therefrom. For example, the measurement values and/or the data obtained therefrom can be transferred wirelessly from a transmitter allocated to the tool to a receiving unit which cooperates with the transmitter and is installed in a positionally-fixed manner in the thermo-compression chamber or externally thereto as part of a multi-platen heat press or another suitable production system. By inserting the tool into the thermo-compression chamber, the cabling now normally required in relation to the measurement value sensor is omitted in this respect. The equipping time and the risk that the machine operator will suffer burns from the cabling of the measurement value sensor are hereby reduced. At the same time, the measurement values obtained within the tool can be sent to the transmitter via cables or wires. In view of the temperature in the thermo-compression chamber and the pressure acting on the tool, this is robust and, at the same time, not prone to errors. In addition, the use of radio measurement value sensors and the wireless data transfer of the measurement values away from the tool would be very expensive owing to the fact that the measurement value sensor as lost sensors cannot be reused. If, in contrast, a thermo-wire for example at the same time forms the measurement value sensor and a signal line leading from the measurement value sensor to the transmitter, the production is extremely cost-effective.

The receiving unit cooperating with the transmitter can be arranged in the thermo-compression chamber itself and the measurement values or the data obtained therefrom are fed via cables or wires away from the thermo-compression chamber to the production control device provided outside the thermo-compression chamber. In an advantageous manner, it can be ensured that the transmitter and the receiving unit are arranged in direct spatial proximity to each other. The wireless data transfer can hereby be effected with extremely few disruptions and with an extremely small amount of energy. For example, the transmitter itself can be supplied with energy wirelessly. The further data transfer from the receiving unit to the production control device on the other hand is effected via cables or wires and is configured in a robust manner corresponding to the production boundary conditions.

The receiving unit can be provided outside the thermo-compression chamber. In an advantageous manner, the receiving unit is subjected to lower thermal loads outside the thermo-compression chamber, which means that in particular cost-effective receiving units can be used.

The transmitter can be fluidically cooled in the thermo-compression chamber. A cooling fluid is supplied and discharged in this case via at least one fluid line. Air and preferably ambient air can be used as the cooling fluid. In an advantageous manner, the thermal loading of the transmitter is reduced by the fluidic cooling. Damage to the transmitter is counteracted in this manner.

A temperature, a pressure or a humidity level can be determined as measurement values. In an advantageous manner, these measurement values provide the basis in order to provide information regarding the quality or functional capability of the circuit board. At the same time, these measurement values can be used in order to intervene on-line in the on-going production method step. In particular through the possibility of the on-line influence on the on-going production method step, processing or cycle times can be successfully reduced to a minimum without disadvantageously influencing the quality or functional capability of the circuit boards. Pressure and/or temperature in the thermo-compression chamber are maintained so long and adjusted in such a manner that the functional and insulation layers are reliably connected to each other in the desired manner.

A target temperature, to which the thermo-compression chamber is to be heated in the on-going production method step, and/or a target pressure applied to the tool in the on-going production method step in the thermo-compression chamber can be increased above a set value for the target temperature or the target pressure or, in terms of a readjustment, can be set differently in the on-going production method step in dependence upon the measurement values and/or the data obtained therefrom. In a similar manner, provision can be made that a temperature-time profile and/or a pressure-time profile to be followed in the on-going production method step are adapted or modified in dependence upon the measurement values and/or the data obtained therefrom.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
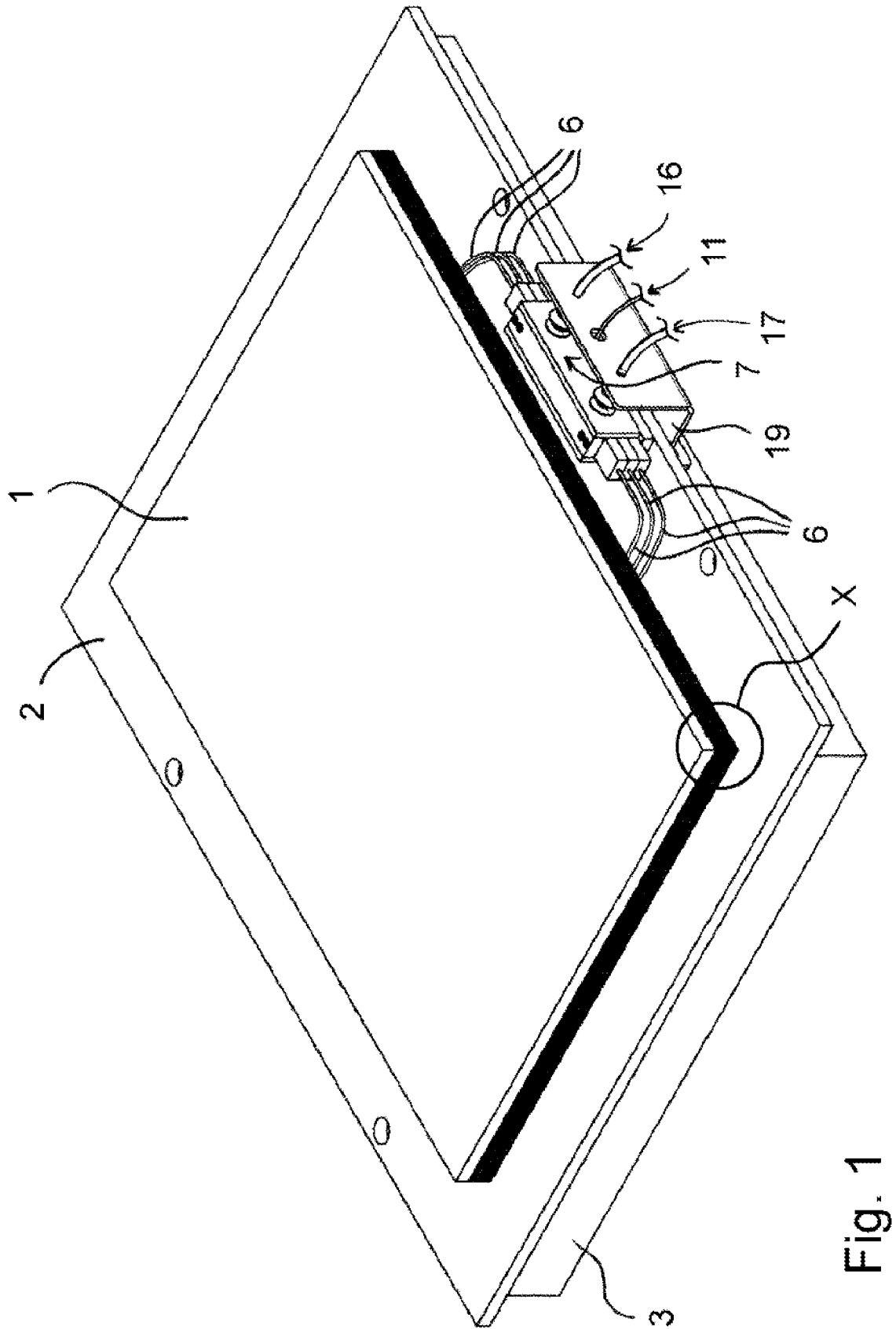
FIG. 1 is a perspective partial view of a device in accordance with the invention for the production of multilayer circuit boards with an equipped multi-part tool, a tool logic module and a measurement value transmission module, wherein a tool lower part of the tool is placed onto a heating plate and a receiving unit of the measurement value transmission module is held on the heating plate.
Figures 2, 3:
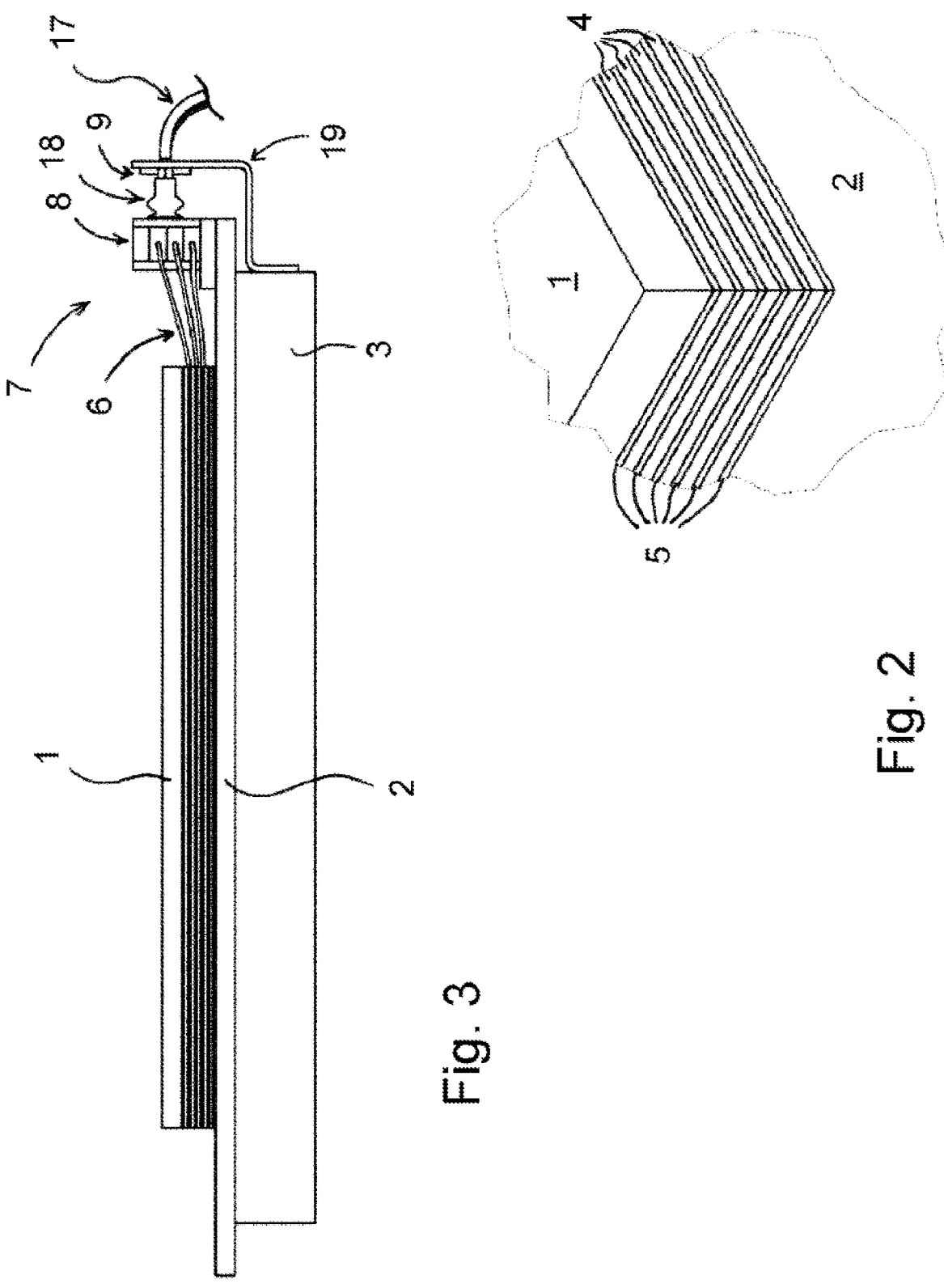
FIG. 2 is an enlarged illustration of a detail X of the arrangement according to FIG. 1.
FIG. 3 is a side view of the arrangement according to FIG. 1.
Figure 4:
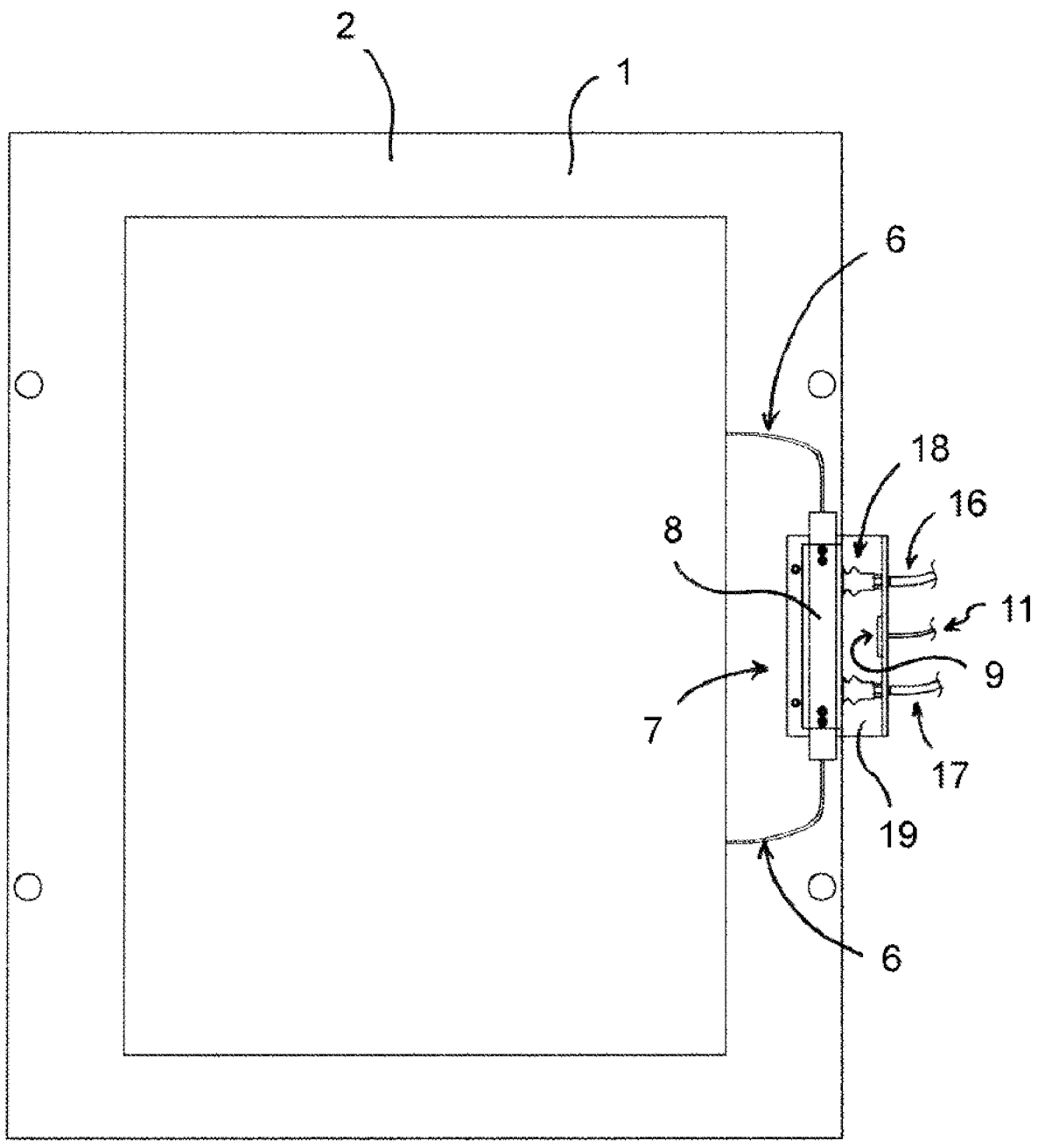
FIG. 4 is a top view of the arrangement of FIG. 1.
Figure 5:
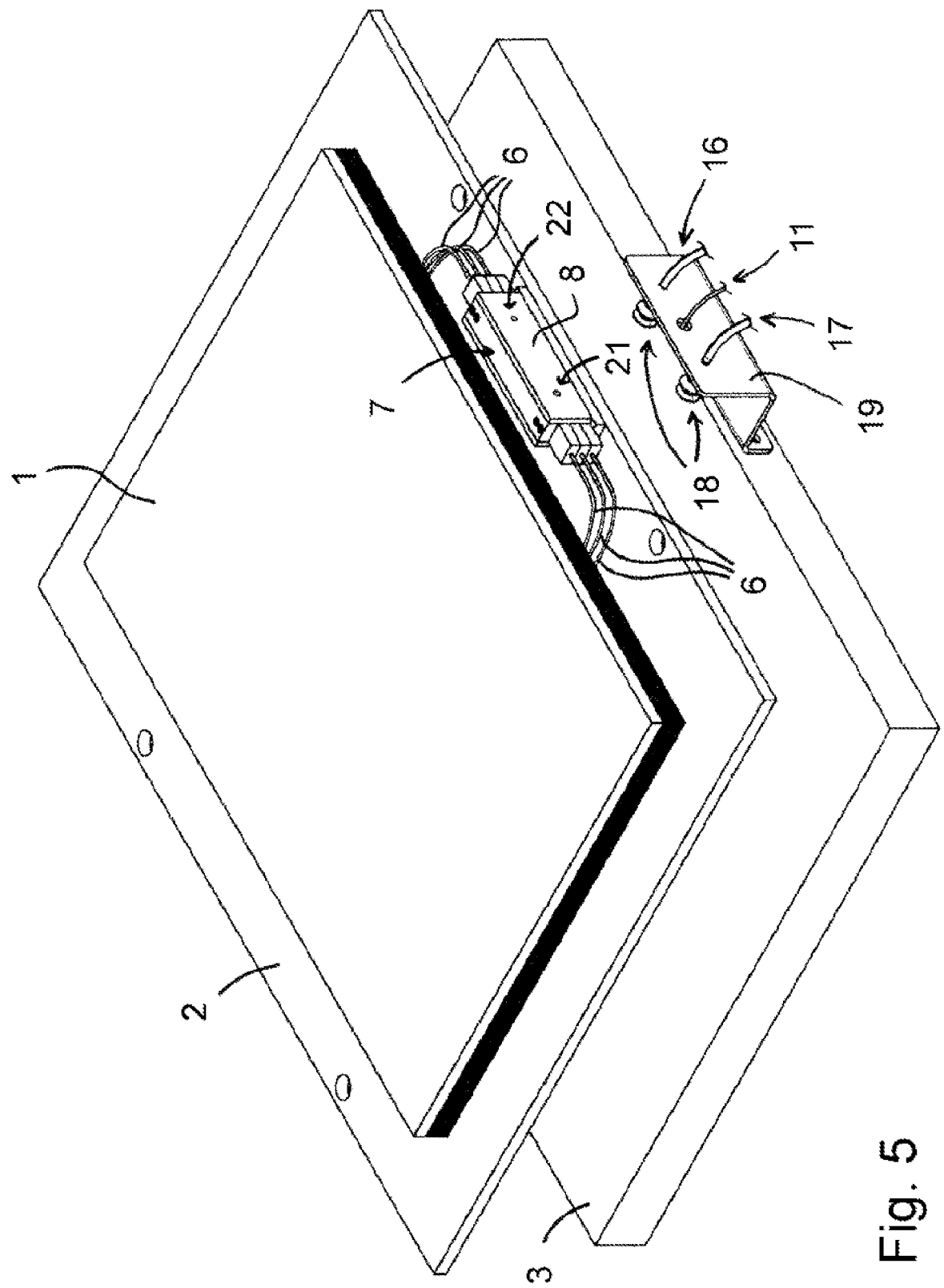
FIG. 5 is an exploded view of the arrangement according to FIG. 1, wherein the equipped, multi-part tool with the tool logic module mounted thereon is disposed spaced apart from the heating plate.
Figure 6:
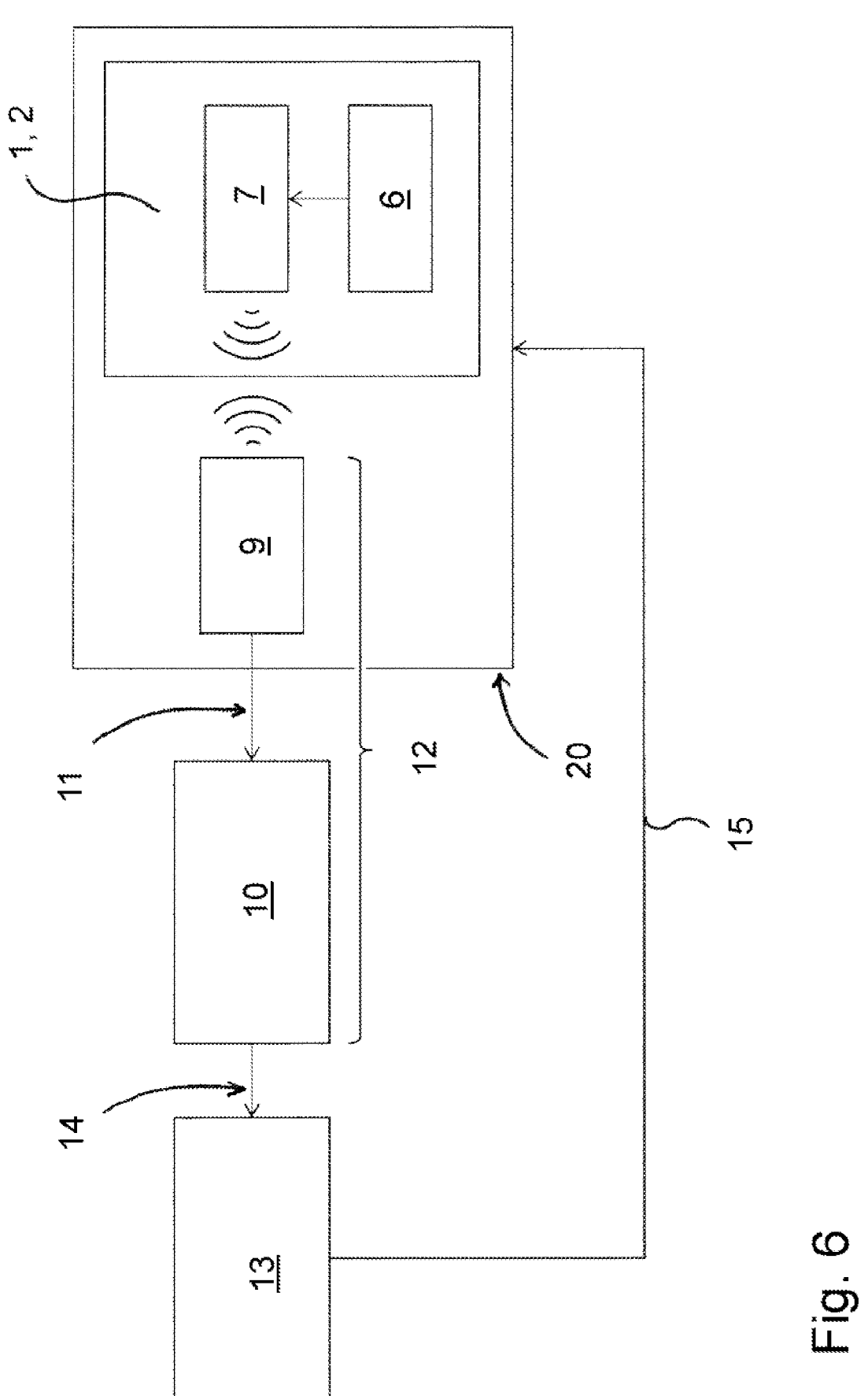
FIG. 6 is a schematic diagram of the device in accordance with the invention as part of a multi-platen heat press with a production control device.

A device in accordance with the invention for the production of multi-layer circuit boards comprises a multi-part tool with a tool lower part 2 and a tool upper part 1, a measurement value sensor and a tool logic module 7, to which measurement values detected by the measurement value sensor are supplied via a signal line. Furthermore, the device comprises a measurement value transmission module 12 with a receiving unit 9 and a transmitting unit 10 as well as a data line 14 serving for onward transmission of the measurement values or of data obtained therefrom. The receiving unit 9 and the transmitting unit 10 of the measurement value transmission module 12 are disposed physically separate from each other and, in the present case, are connected to each other in terms of data technology via a line 11.

During normal use of the device in accordance with the invention, the tool with the tool upper part 1 and the tool lower part 2, the tool logic module 7, the measurement value sensor and the receiving unit 9 of the measurement value transmission module 12 are disposed together with a plurality of heating plates 3 in a thermo-compression chamber 20 of a multi-platen heat press. The transmitting unit 10 of the measurement value transmission module 12 and a production control device 13—connected via the data line 14 to the transmitting unit 10—of the multi-platen heat press are provided outside the thermo-compression chamber 20. The production control device 13, the thermo-compression chamber 20 and the heating plates 3 are not part of the device in accordance with the invention. However, together with the device in accordance with the invention, they belong to the multi-platen heat press.

During the production of multi-layer circuit boards, initially in a preparatory assembly method step outside the thermo-compression chamber 20 of the multi-platen heat press, functional layers 5 and insulation layers 4 of the circuit board to be produced are disposed in the tool in an alternating manner and are layered between the tool upper part 1 and the tool lower part 2. During the layering, in the present example of the invention, a total of six thermo-wires 6, which at the same time form the measurement value sensor and the signal line of the device in accordance with the invention, are disposed between the layers 4, 5. The thermo-wires 6 are preferably arranged between different layers 4, 5 so that the thermo-wires 6 lie outside the circuit board of layer construction, which is subsequently to be produced by cutting.

The thermo-wires 6 are passed out of the layer construction to the tool logic module 7 and contacted at that location.

The tool logic module 7, which provides a housing 8, a transmitter and further functional components for the reception and/or storage and/or post-processing of the measurement values, is fixed to the tool lower part 2 of the tool. The internal structure of the tool logic module 7 is produced in such a way that the measurement values supplied via the signal line reach the transmitter.

In the manner described above, during preparation for the production of the multi-layer circuit boards, a plurality of tools are pre-configured or pre-assembled and transported to the multi-platen heat press in an equipping method step via a suitable handler, preferably in an automated manner. The plurality of tools are then inserted into the thermo-compression chamber 20 of the multi-platen heat press in such a way that each tool is laid from above with an underside of its tool lower part 2 onto a heating plate 3 and is positioned relative thereto. In so doing, the number of the heating plates 3 in the thermo-compression chamber 20 is preferably selected in such a way that one heating plate 3 is provided under each tool lower part 2 and that, in addition, a further heating plate 3 is provided above the tool upper part 1 of an uppermost tool in the thermo-compression chamber 20.

During insertion of the tools into the thermo-compression chamber 20 of the multi-platen heat press, the tool logic module 7 is positioned with the transmitter adjacent to the receiving unit 9—likewise installed in the thermo-compression chamber 20—of the measurement value transmission module 12. Between the transmitter of the tool logic module 7 and the receiving unit 9 of the measurement value transmission module 12, a distance is selected in such a way that a wireless transmission of the measurement values or of the data obtained therefrom from the transmitter of the tool logic module 7 to the receiving unit 9 is possible.

In the present case, the wireless transmission is effected by way of example using a near field communication routine. The transmitter of the tool logic module 7 then comprises, for example, an NFC coil (NFC: Near Field Communication) and the receiving unit 9 of the measurement value transmission module 12 is designed as an NFC reader or provides such an NFC reader. The NFC coil and the NFC reader cooperate in such a way that the measurement values or the data obtained therefrom are transmitted or forwarded wirelessly.

For example, a power supply for the tool logic module (7) is produced within the NFC communication via the measurement value transmission module (12).

In order to safeguard the transmitter of each tool relative to the receiving unit 9 of the measurement value transmission module 12 allocated to the respective tool at the same time as the tools are being positioned on the heating plates 3, a support body 19 is provided on each heating plate 3, to which support body the receiving unit 9 is fixed. In the present example of the invention, the support body 19 is formed, by way of example, by a double L-shaped or Z-shaped profiled body.

Now, in order to connect the functional layers and insulation layers 4, 5 arranged in the tool to each other, the thermo-compression chamber 20 is heated to about 180° C. At the same time, the heating plates 3 are moved towards each other and in this way the layers 4, 5 are pressed against each other in the tools. After a certain holding time, which varies in particular depending on the temperature, the pressure and the material of the functional and insulation layers 4, 5 used, the layers 4, 5 are then connected to each other in an integrally bonded manner, wherein adjacent functional layers 5 are each separated from each other and insulated with respect to each other by an insulation layer 4. The thermo-wires 6 are fixedly connected to the layer construction. As lost sensors they cannot be reused.

In order to protect the functional components of the tool logic module 7 and in particular the transmitter against an excessively high temperature, in the present example of the invention, fluidic cooling is effected for the tool logic module 7. The fluidic cooling provides two fluid lines 16, 17, via which a cooling fluid is supplied and discharged. Furthermore, an inlet opening 21 and an outlet opening 22 for the cooling fluid are provided on the housing 8 of the tool logic module 7.

Elastic connection sleeves 18, which are fixed to the support body 19 on a side facing the tool logic module, are used to connect the inlet opening and outlet opening 21, 22 to the fluid lines 16, 17. The connection sleeves 18 are connected to the fluid lines 16, 17.

Furthermore, the connection sleeves 18 are positioned on the support body 19 in such a way that they are placed against the inlet opening and outlet opening 21, 22 when the tool is being inserted into the thermo-compression chamber 20. The connection sleeves 18 can thereby be elastically deformed. As a result of the deformation, a pressing force is provided which leads to a sufficiently tight connection and to only slight leakage.

The cooling fluid passes via a first fluid line 16 and a first connection sleeve 18 to the inlet opening 21 of the housing 8 and flows away via the outlet opening 22, a second connection sleeve 18 and a second fluid line 17. In the present case, the housing 8 itself serves as the fluid duct and connects the inlet opening and outlet opening 21, 22. In this way, the functional components of the tool logic module 7, which are installed in the housing 8, are cooled.

Ambient air, for example, can be used as the cooling fluid, this air being supplied from outside the thermo-compression chamber.

By using the device in accordance with the invention as part of a multi-platen heat press, it is possible to improve the production of multi-layer circuit boards. The measurement values determined with the aid of the thermo-wire and/or the data obtained therefrom can be supplied to the production control device (13) of the multi-platen heat press on-line, i.e. directly in the on-going production method step. With the aid of the measurement values and/or the data obtained therefrom, the production control device (13) can decide whether intervention in the on-going production method step is necessary, and, for example, extend or reduce the holding time or re-adjust the temperature and/or the pressure. The production control device can be formed in this respect in particular in order to compare the measurement values and/or the data obtained therefrom with stored and/or calculated set values, in particular with set values for the duration of the on-going production method step, for a target temperature to which the thermo-compression chamber (20) is heated, or for a target pressure applied to the tool in the thermo-compression chamber (20). In this manner, deviations from target course and actual course can be detected early and measures for error avoidance or error correction can be initiated in good time. In addition, the measurement values and/or the data obtained therefrom can be stored for documentation purposes.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for to produce multi-layer circuit boards, the method comprising:

arranging, within an assembly method step, at least two functional layers and at least one insulation layer of a circuit board to be produced in a layered manner between a tool lower part and a tool upper part of a multi-part tool;

positioning at least one measurement value sensor between the tool upper part and the tool lower part such that the measurement value sensor lies against at least one of the at least two functional layers and/or the at least one insulation layer of the circuit board to be produced;

inserting, in an equipping step, the multi-part tool with the at least two functional layers and the at least one insulation layer and the at least one measurement value sensor into a thermo-compression chamber;

pressing, in a production step, the tool upper part and the tool lower part against each other in the thermo-compression chamber, with the at least two functional layers, provided therebetween and the at least one insulation layer and the measurement value sensor provided between the tool upper part and the tool lower part, the tool upper part and the tool lower part being pressed together while being heated via at least a first heating plate, wherein the tool lower part is positioned on top of the first heating plate;

detecting measurement values by the measurement value sensor;

transferring the measurement values and/or data obtained therefrom to a production control device during the production step; and processing the measurement values and/or the data obtained therefrom by the production control device during the production step to monitor the production step and/or to control the production step in relation to a set value for a measurement variable of the measurement value sensor.

2. The method as claimed in claim 1, wherein the measurement values are transferred to the production control device in part wirelessly.

3. The method as claimed in claim 2, wherein the measurement values are transferred in a hybrid manner or in part wirelessly or in part via cables or wires.

4. The method as claimed in claim 1, wherein the measurement values are fed away from the multi-part tool via cables or wires.

5. The method as claimed in claim 1, wherein the measurement values are fed via cables or wires away from the thermo-compression chamber to the production control device provided outside the thermo-compression chamber.

6. The method as claimed in claim 2, wherein the measurement values are transferred wirelessly from a transmitter arranged in the thermo-compression chamber to a receiver cooperating with the transmitter.

7. The method as claimed in claim 6, wherein the transmitter is fluidically cooled in the thermo-compression chamber, and wherein a cooling fluid is supplied and/or discharged via at least one fluid line.

8. The method as claimed in claim 6, wherein the transmitter together with the multi-part tool or as part thereof is positioned and/or aligned relative to the receiver when the multi-part tool is being inserted into the thermo-compression chamber.

9. The method as claimed in claim 1, wherein a temperature and/or a pressure and/or a humidity level are determined as the measurement values.

10. The method as claimed in claim 1, wherein, during the processing of the measurement values and/or the data obtained therefrom by the production control device, the measurement values and/or the data obtained therefrom are compared with stored reference values, and wherein the set values form the basis of the comparison as reference values for the measurement variable of the measurement value sensor.

11. The method as claimed in claim 1, wherein a duration of the production step is determined in dependence upon the measurement values and/or the data obtained therefrom, and/or in wherein the production step is continued beyond a set value for the duration of the production step or is terminated before reaching the set value for the duration of the production step.

12. The method as claimed in claim 1, wherein a target temperature to which the thermo-compression chamber is heated is increased above a set value for the target temperature and/or is set differently from the set value for the target temperature in the production step in dependence upon the measurement values and/or the data obtained therefrom.

13. The method as claimed in claim 1, wherein a target pressure applied to the multi-part tool in the thermo-compression chamber is increased above a set value for the target pressure and/or is set differently from the set value for the target pressure in the production step in dependence upon the measurement values and/or the data obtained therefrom.

14. The method as claimed in claim 1, further comprising a second heating plate that is positioned on top of the tool upper part, such that during the pressing step, the tool upper part and the tool lower part are pressed and heated by both the first heating plate and the second heating plate.

15. The method as claimed in claim 1, wherein the measurement values are transferred wirelessly from a transmitter arranged in the thermo-compression chamber to a receiver arranged in the thermo-compression chamber, and the receiver transmits the measurement values to the production control device that is located outside of the thermos-compression chamber.

16. The method as claimed in claim 15, wherein the transmitter is arranged in a housing that is positioned on top of the tool lower part, and wherein the receiver is positioned outside of the housing.

17. The method as claimed in claim 15, further comprising a support body, wherein a first end of the support body is mounted to the first heating plate and the receiver is mounted to a second end of the support body.

18. The method as claimed in claim 17, wherein the transmitter is arranged in a housing, wherein the transmitter is fluidically cooled by a cooling fluid, wherein the cooling fluid is supplied and/or discharged to the housing via at least one fluid line, and wherein the second end of the support body is provided with an opening through which the at least one fluid line extends.

* * * * *